(12) United States Patent
Kim et al.

(10) Patent No.: US 10,319,930 B2
(45) Date of Patent: Jun. 11, 2019

(54) QUANTUM ROD, QUANTUM ROD FILM AND QUANTUM ROD DISPLAY DEVICE INCLUDING THE SAME

(71) Applicants: LG DISPLAY CO., LTD., Seoul (KR); KOREA ADVANCED INSTITUTE OF SCIENCE AND TECHNOLOGY, Daejeon (KR)

(72) Inventors: Kyu-Nam Kim, Paju-si (KR); So-Mang Kim, Seoul (KR); Duk-Young Jeon, Daejeon (KR); Yong-Hee Lee, Busan (KR)

(73) Assignees: LG DISPLAY CO., LTD., Seoul (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 15/858,754

(22) Filed: Dec. 29, 2017

(65) Prior Publication Data
US 2018/0190920 A1 Jul. 5, 2018

(30) Foreign Application Priority Data
Dec. 29, 2016 (KR) .................. 10-2016-0181915

(51) Int. Cl.
| | |
|---|---|
| H01L 27/15 | (2006.01) |
| H01L 51/50 | (2006.01) |
| H01L 51/52 | (2006.01) |
| G02F 1/017 | (2006.01) |
| G02F 1/01 | (2006.01) |
| G02F 2/02 | (2006.01) |
| B82Y 20/00 | (2011.01) |
| B82Y 10/00 | (2011.01) |
| H01L 27/32 | (2006.01) |
| H01L 29/66 | (2006.01) |

(52) U.S. Cl.
CPC ............ *H01L 51/502* (2013.01); *G02F 1/017* (2013.01); *G02F 1/0136* (2013.01); *G02F 2/02* (2013.01); *H01L 51/5293* (2013.01); *B82Y 10/00* (2013.01); *B82Y 20/00* (2013.01); *G02F 2001/01783* (2013.01); *G02F 2202/106* (2013.01); *G02F 2202/107* (2013.01); *H01L 27/156* (2013.01); *H01L 27/3244* (2013.01); *H01L 29/66977* (2013.01); *Y10S 977/762* (2013.01); *Y10S 977/824* (2013.01); *Y10S 977/949* (2013.01); *Y10S 977/952* (2013.01)

(58) Field of Classification Search
CPC ................. H01L 51/502; H01L 27/156; H01L 29/66977; B82Y 20/00
USPC .......................................................... 257/79
See application file for complete search history.

(56) References Cited

U.S. PATENT DOCUMENTS

| | | | |
|---|---|---|---|
| 6,855,202 B2 * | 2/2005 | Alivisatos ................ | C30B 7/00 117/68 |
| 9,146,419 B1 * | 9/2015 | Anandan .............. | G02B 6/0035 |

(Continued)

FOREIGN PATENT DOCUMENTS

WO WO 2010/095140 A2 8/2010

*Primary Examiner* — George R Fourson, III
(74) *Attorney, Agent, or Firm* — Birch, Stewart, Kolasch & Birch, LLP

(57) ABSTRACT

Embodiments relate to a quantum rod, a quantum rod film, a quantum rod display device with a quantum rod. The quantum rod includes a first core, a second core separated from the first core, and a first shell surrounding the first and second cores.

22 Claims, 9 Drawing Sheets

(56) References Cited

U.S. PATENT DOCUMENTS

| | | | | |
|---|---|---|---|---|
| 9,164,353 B2* | 10/2015 | Jeon, II | .................... | G02F 2/02 |
| 2014/0145144 A1* | 5/2014 | Jeong | .................... | H01L 29/125 |
| | | | | 257/13 |
| 2014/0326949 A1* | 11/2014 | Xu | ........................ | C09K 11/02 |
| | | | | 257/13 |
| 2017/0102588 A1* | 4/2017 | Im | .................... | G02F 1/133514 |

* cited by examiner

QUANTUM ROD, QUANTUM ROD FILM AND QUANTUM ROD DISPLAY DEVICE INCLUDING THE SAME

CROSS-REFERENCE TO RELATED APPLICATION

This application claims priority to and the benefit of Korean Patent Application No. 10-2016-0181915 filed in Republic of Korea on Dec. 29, 2016, which is hereby incorporated by reference into the present application.

BACKGROUND OF THE INVENTION

Field of the Invention

Embodiments of the invention relate to a quantum rod (QR), and more particularly, to a QR having high quantum efficiency and high off-property and a QR film and a QR display device including the same.

Discussion of the Related Art

Recently, applications of the QR to display devices and lightening devices have been researched.

Since the QR has high emitting efficiency and excellent reproducibility, the QR can be applied to various uses.

Since extinction coefficient and quantum yield of the QR is very large in comparison to general dyes, the QR emits strong fluorescent light. In addition, by controlling a diameter of the QR, a wavelength of light emitted from the QR can be controlled.

The QR emits linearly-polarized light. Namely, the light from the QR has a linearly-polarized property along a length direction of the QR. In addition, the QR has an optical property that is capable of controlling emission by an electric field applied from the outside. This may be referred to as stark effect. By using these properties, the optical efficiency of the display device and/or the lightening device can be improved.

FIGS. 1A and 1B are schematic view illustrating a driving principle of the related art QR.

As shown in FIGS. 1A and 1B, a QR 20 includes a core 22, which is formed a nano-size semiconductor material, and a shell 24 covering the core 22. For example, the core 22 may be formed of the XII-XVI group semiconductor material, the XIII-XV group semiconductor material, the XI-XIII-XVI group semiconductor material or the XIV-XVI group semiconductor material, and the shell 24 may be formed of XII-XVI group semiconductor material such as ZnS.

As shown in FIG. 1A, the QRs 20 are arranged on a base 10. Without voltage, the electron "e−" and the hole "h+" are combined in the core 22 such that the QR 20 emits the light. (emission ON)

On the other hand, as shown in FIG. 1B, with voltage, i.e., with an electric field "E", the electron "e−" and the hole "h+" are separated such that the emission of the QR 20 is finished. (emission OFF)

Namely, the QR 20 is driven by the electric field, and the QR 20 is used for the display device and/or the lightening device.

In the related art QR 20, the quantum efficiency and the off property are in the trade-off relation.

Namely, in a QR display device (or a QR lightening device) including high quantum efficiency (or emission efficiency) QRs 20, the off property of the QR is low such that the contrast ratio is decreased. On the other hand, in a QR display device (or a QR lightening device) including high off property QRs 20, the quantum efficiency of the QR is low such that the brightness is decreased.

SUMMARY OF THE INVENTION

Accordingly, embodiments of the invention are directed to a QR, a QR film, and a QR display device including the same that substantially obviate one or more of the problems due to limitations and disadvantages of the related art, and have other advantages.

An objective of the invention is to provide a QR having advantages in the quantum efficiency and the off property.

Another objective of the invention is to provide a QR film having advantages in the quantum efficiency and the off property.

Another objective of the invention is to provide a QR display device having advantages in the quantum efficiency and the off property.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

Embodiments relate to a quantum rod including a first core; a second core separated from the first core; and a first shell surrounding the first and second cores.

Embodiments also relate to a quantum rod film including a polymer matrix and a quantum rod in the polymer matrix, where the quantum rod includes a first core; a second core separated from the first core; and a first shell surrounding the first and second cores.

Embodiments also relate to a quantum rod display device including first and second substrates facing each other; a pixel electrode and a common electrode on the first substrate; a quantum rod layer positioned between the first substrate and the second substrate and including a quantum rod, the quantum rod including: a first core; a second core separated from the first core; and a first shell surrounding the first and second cores; and a backlight unit under the first substrate.

It is to be understood that both the foregoing general description and the following detailed description are examples and are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE EMBODIMENTS

Reference will now be made in detail to embodiments of the invention, examples of which are illustrated in the accompanying drawings.

Figure 1A:
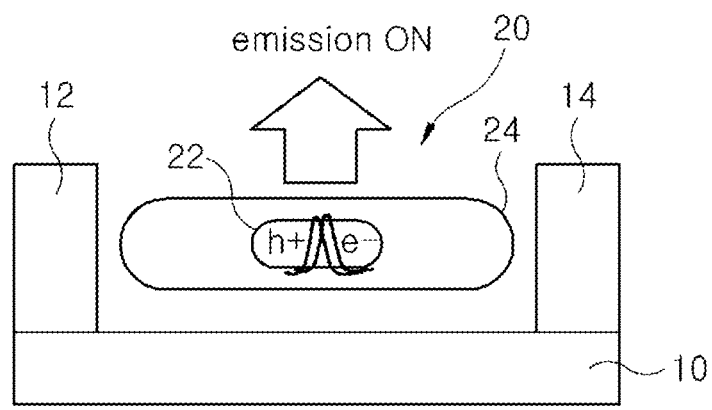
FIGS. 1A and 1B are schematic view illustrating a driving principle of the related art QR.
Figure 1B:
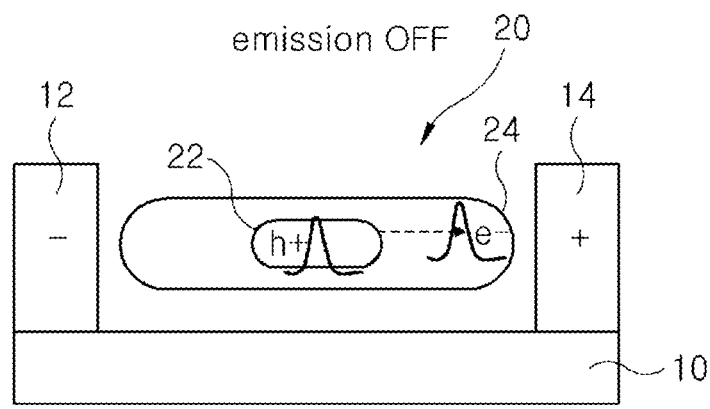
Figure 2A:
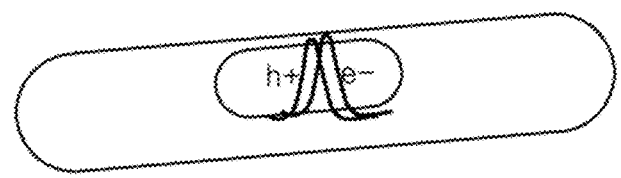
FIGS. 2A and 2B are schematic view illustrating a trade-off relation between the quantum efficiency and the off property according to a core length of the related art QR.
Figure 2A:
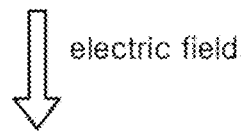
Figure 2A:
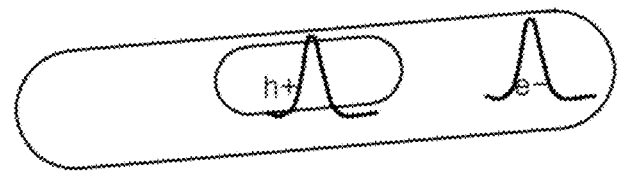
Figure 2B:
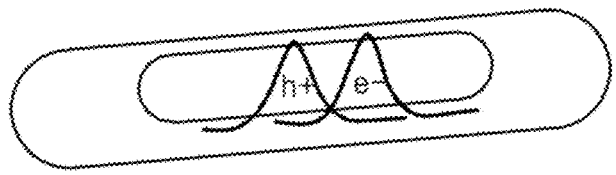
Figure 2B:
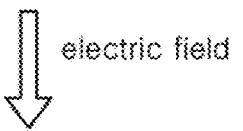
Figure 2B:

FIGS. 2A and 2B are schematic view illustrating a trade-off relation between the quantum efficiency and the off property according to a core length of the related art QR.

To control the quantum efficiency and the off property (driving property), a length of the QR is controlled. However, the quantum efficiency and the off property are in the trade-off relation.

Namely, as shown in FIG. 2A, when the length of the core in the QR is relatively short (short-core QR), the combination probability of the hole "h+" and the electron "e−" in the core is high without the electric field such that the quantum efficiency (the emission efficiency) is increased. However, since the separation of the hole and the electron with the electric field is difficult, the off property of the QR is decreased.

On the other hand, as shown in FIG. 2B, when the length of the core in the QR is relatively long (long-core QR), the combination probability of the hole "h+" and the electron "e−" in the core is low without the electric field such that the quantum efficiency (the emission efficiency) is decreased. However, since the separation of the hole and the electron with the electric field is easy, the off property of the QR is improved.

Namely, only one of the quantum efficiency and the off property is improved by controlling the core length of the QR, but the QR having advantages in both of the quantum efficiency and the off property is not proved. Accordingly, the display device including the QR has a disadvantage in the brightness or the contrast ratio.

Figure 3:
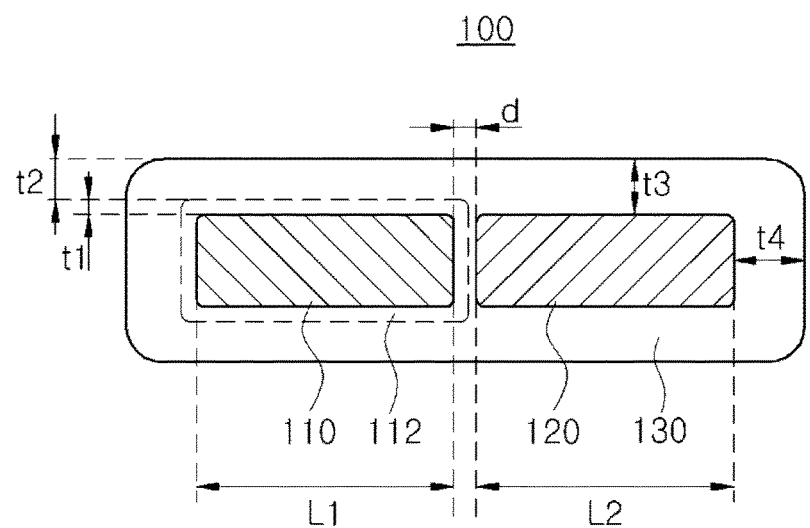
FIG. 3 is a schematic cross-sectional view of a QR according to a first embodiment of the present invention.
Figure 4A:
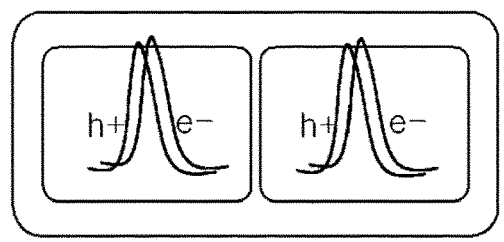
FIGS. 4A and 4B are schematic view illustrating an ON state and an OFF state of a QR.
Figure 4B:
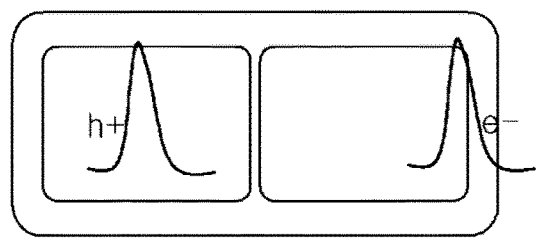

FIG. 3 is a schematic cross-sectional view of a QR according to a first embodiment of the present invention, and FIGS. 4A and 4B are schematic view illustrating an ON state and an OFF state of a QR according to an embodiment of the present invention.

As shown in FIG. 3, a QR 100 includes a first core 110, a second core 120, which is spaced apart from the first core 110, and a first shell 130 surrounding (covering) the first and second cores 110 and 120.

Each of the first and second cores 110 and 120 may include the XII-XVI group semiconductor material, the XIII-XV group semiconductor material, the XI-XIII-XVI group semiconductor material or the XIV-XVI group semiconductor material. The first and second cores 110 and 120 may include the same material or different materials.

For example, each of the first and second cores 110 and 120 may include one of CdSe, CdS, CdTe, ZnSe, ZnS, ZnTe, HgSe, HgTe, CdZnSe (XII-XVI group semiconductor material), InP, InN, GaN, InSb, InAsP, InGaAs, GaAs, GaP, GaSb, AlP, AlN, AlAs, AlSb (XIII-XV group semiconductor material), PbSe, PbTe, and PbS (XIV-XVI group semiconductor material).

The first core 110 has a first length L1, and the second core 120 has a second length L2 being substantially same as the first length L1. Namely, along a major axis of the QR 100, the first and second cores 110 and 120 may have substantially the same length.

The wavelength of the emitted light from the QR 100 is determined by a size, i.e., a diameter, of each of the first and second cores 110 and 120. Namely, by controlling the size of the first and second cores 110 and 120, the QR 100 may emit one of the red light, the green light and the blue light. However, it is not limited thereto.

The first shell 130 may include the XII-XVI group semiconductor material. For example, the first shell 130 may include one of ZnS, ZnSe, ZnTe, CdSe, CsTe, CdS, CdSeS, CdTeS, CdSeTe, ZnSeS, ZnTeS, ZnSeTe, CdZnSe, CdZnS, CdZnTe, CdZnSeS, CdZnTeS and CdZnSeTe.

As shown in FIG. 3, the QR 100 of the present invention has a dual core structure.

In addition, the QR 100 may further include a second shell 112 surrounding the first core 110. The second shell 112 may include the same material as the first shell 130 or a different material from the first shell 130. The second core 120 contacts the second shell 112.

The second shell 112 has a first thickness t1, and the first shell 130 has a second thickness t2, which is greater than the first thickness t1, in a portion corresponding to the first core 110 or the second shell 112. When the first thickness t1 of the second shell 112 is too large, the first and second cores 110 and 120 are independently driven with an electric field such that there may be a problem in the off property of the QR 100.

In the present invention, after the first core 110 is grown, the second core 120 is grown at a side of the first core 110. Without the second shell 112 surrounding the first core 110, the first and second cores 110 and 120 are integrated as one-body such that the QR 100 has a single long core.

In this instance, as explained with FIG. 2B, the off property of the QR is improved, while the quantum efficiency of the QR is decreased.

However, in the QR 100 of the present invention, since the first and second cores 110 and 120 are separated to provide the dual core structure, the off property of the QR 100 is improved without decrease of the quantum efficiency.

On the other hand, when the second shell 112 is formed of the same material as the first shell 130, it seems to appear that the first shell 130 directly surrounds the first and second cores 110 and 120 without the second shell 112.

In the present invention, the QR 100, where the first and second cores 110 and 120 are arranged to be separated, and the first shell 130 surrounding the first and second cores 110 and 120, is provided. In this instance, a distance d between the first and second cores 110 and 120 is smaller than a thickness t3 or t4 of the first shell 130. The thickness t3 or t4 of the first shell 130 is a thickness of a portion of the first shell 130 at a side of the first core 110 or the second core 120.

Referring to FIG. 4A, without the electric field, the first core 110 (of FIG. 3) and the second core 120 (of FIG. 3) are independently driven such that the quantum efficiency of the QR 100 is improved.

Namely, without the electric field, the QR 100 is driven similar to the short-core QR as explained with FIG. 2A.

In other words, since each of the first and second cores 110 and 120 has smaller length than a total length of the first and second cores 110 and 120, the combination probability of the hole "h+" and the electron "e−" in each of the first and second cores 110 and 120 is increased such that the quantum efficiency of the QR is improved. As a result, the brightness of the display device using the QR 100 is increased.

On the other hand, referring to FIG. 4B, with the electric field, since the first and second cores 110 and 120 acts as a single core, the hole "h+" and the electron "e−" are separated through the whole of the QR 100. As a result, the off property of the QR 100 is improved.

Namely, with the electric field, the QR 100 of the present invention is driven similar to the long-core QR as explained with FIG. 2B. Accordingly, the off property of the display device using the QR 100 is improved, and the contrast ratio of the display device is increased.

[Synthesis of the QR]

Referring to FIGS. 5A to 5D, which are TEM pictures illustrating a synthesis method of a QR, the exemplary synthesis of the QR is explained.

(1) Synthesis of the First Core (CdS)

1) Solution 1

Trioctylphosphine oxide (TOPO, 3.0 g), octadecylphosphonic acid (ODPA, 0.280 g), hexylphosphonic acid (HPA, 0.083 g) and cadmium oxide (0.062 g) were put into the three-neck round flask, and the pressure was reduced under the temperature of 150° C. for 1 hr.

2) Solution 2

Sulfur (0.024 g) was dispersed in 1-octadecene (0.3 ml) and was reacted under the temperature of 300° C. for 1 hr.

3) After the solution 1 was reacted under $N_2$ condition and the under the temperature of 370° C. for 10 minutes and was cooled into the temperature of 330° C., the solution 2 was injected and reacted for 35 seconds.

Figure 5A:
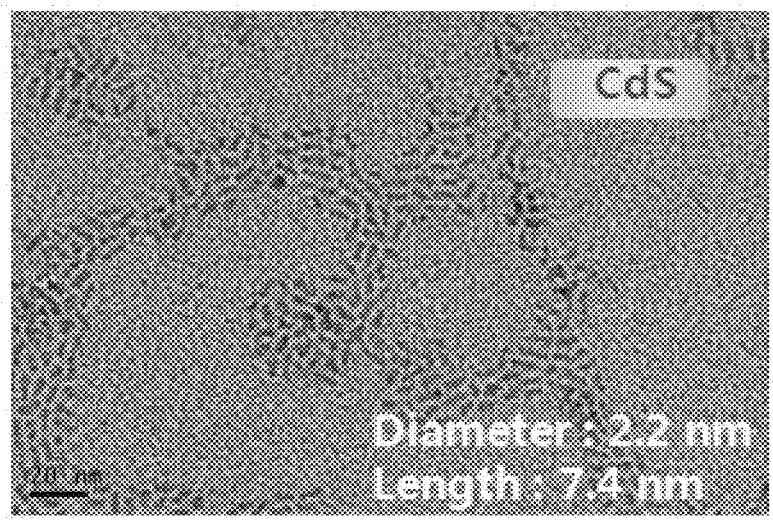
FIGS. 5A to 5D are TEM pictures illustrating a synthesis method of a QR.

4) After the mixture was cooled into the room temperature, a mixture of toluene and methanol (1:3) was added. The centrifugal process is performed to obtain the first core. (FIG. 5A)

(2) Synthesis of the Second Shell (CdS/ZnS)

Sulfur (0.022 g), oleyamine (5.5 ml), zinc sulfate heptahydrate (0.070 g), zinc nitrate hexahydrate (0.012 g) and the first core (0.100 mg) were put into the three-neck round flask, and the pressure was reduced under the temperature of 120° C. for 1 hr. The mixture was reacted under $N_2$ condition and the under the temperature of 230 for 10 minutes.

Figure 5B:
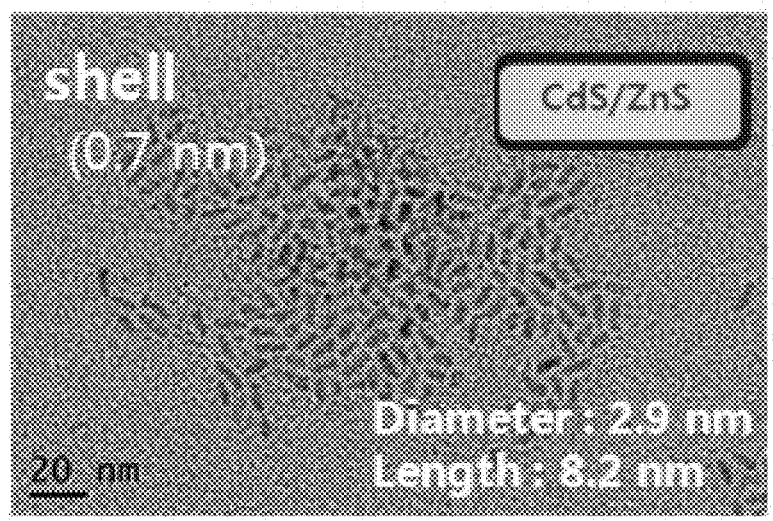

After the resultant was cooled into the room temperature, a mixture of toluene and methanol (1:3) was added. The centrifugal process is performed to obtain a first rod (first core/second shell). (FIG. 5B)

(3) Synthesis of the Second Core (CdS/ZnS/CdS)

1) Solution 3

The first rod (100 mg), TOPO (3.0 g), ODPA (0.280 g), HPA (0.083 g) and cadmium oxide (0.062 g) were put into the three-neck round flask, and the pressure was reduced under the temperature of 150° C. for 1 hr.

2) Solution 4

Sulfur (0.024 g) was dispersed in 1-octadecene (0.3 ml) and was reacted under the temperature of 300° C. for 1 hr.

3) After the solution 3 was reacted under $N_2$ condition and the under the temperature of 370° C. for 10 minutes and was cooled into the temperature of 330° C., the solution 4 was injected and reacted for 35 seconds.

Figure 5C:
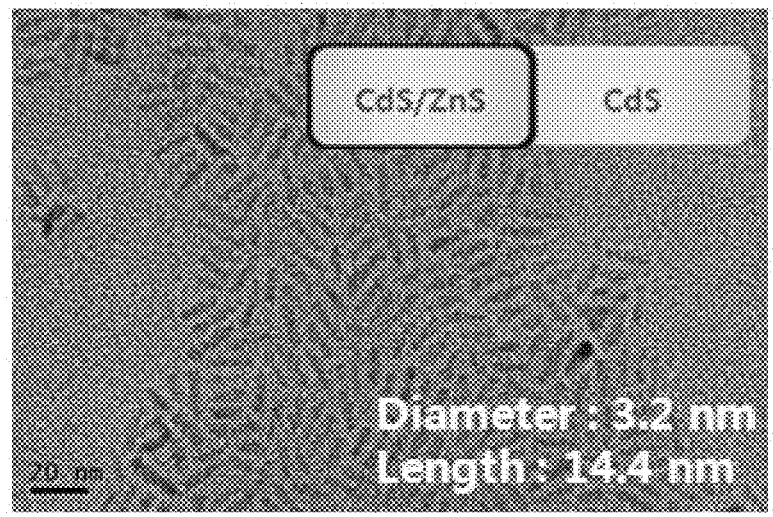

4) After the mixture was cooled into the room temperature, a mixture of toluene and methanol (1:3) was added. The centrifugal process is performed to obtain a second rod (CdS/ZnS/CdS). (FIG. 5C)

(4) Synthesis of the First Shell (Synthesis of the QR)

Sulfur (0.0148 g), oleyamine (5.5 ml), zinc sulfate heptahydrate (0.0375 g), zinc nitrate hexahydrate (0.039 g), core (0.100 mg), the second rod (100 mg) were put into the three-neck round flask, and the pressure was reduced under the temperature of 120° C. for 1 hr. The mixture was reacted under $N_2$ condition and the under the temperature of 230° C. for 1 hr.

Figure 5D:
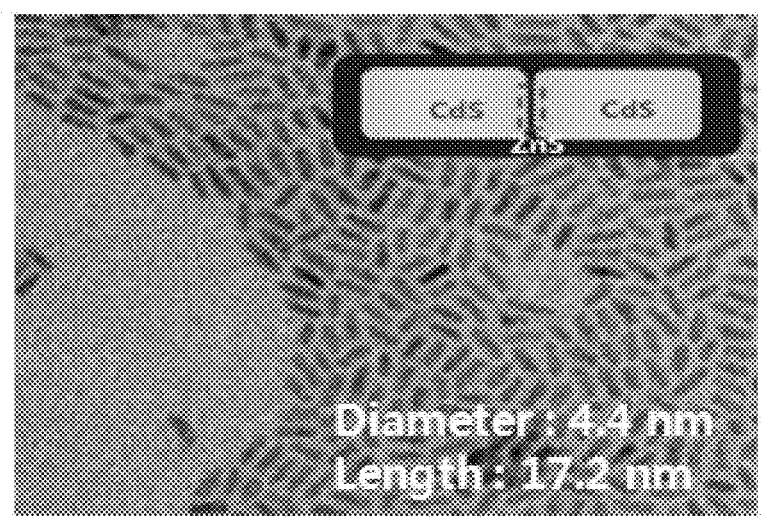

After the resultant was cooled into the room temperature, a mixture of toluene and methanol (1:3) was added. The centrifugal process is performed to obtain the QR including the first shell. (FIG. 5D)

In the TEM-EDX (Transmission Electron Microscopy Energy Dispersive X-ray Spectroscopy) of the synthesized QR, along the length direction of the QR, after the ratio of the CD component is increased at a position of the first core, the ratio of the CD component is decreased. The ratio of the CD component is increase again at a position of the second core. Namely, the dual core structure of the QR in the present invention is shown or identified in the TEM-EDX.

The wavelength (PL peak) of the single short-core QR (Ref1), the single long-core QR (Ref2) and the QR of the present invention (Ex) are measured and listed in Table 1. The wavelengths are shown in FIG. 6.

TABLE 1

|  | PL Peak |
| --- | --- |
| Ref1 | 445 nm |
| Ref2 | 478 nm |
| Ex | 465 nm |

Figure 6:
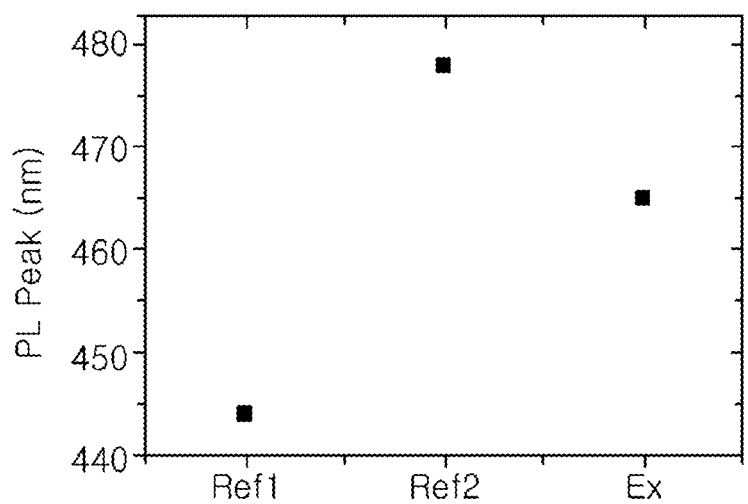
FIG. 6 is a graph showing an emission wavelength of a QR.

As shown in Table 1 and FIG. 6, when the length of the core is increased, the band gap interference is increased such that the wavelength of the light from the QR is shifted into the long wavelength. (Ref2) However, in the dual-core structure QR of the present invention (Ex), although a total length of the cores is increased, there is the interference between the cores except the band gap interference such that the shift problem into the long wavelength is decreased.

The off property (off ratio) and the quantum efficiency (PL QY) of the single short-core QR (Ref1), the single long-core QR (Ref2) and the QR of the present invention (Ex) are measured and listed in Table 2. The off property and the quantum efficiency are shown in FIGS. 7 and 8, respectively.

TABLE 2

|  | Off ratio (@100 V) | PL QY |
| --- | --- | --- |
| Ref1 | 50 | 16% |
| Ref2 | 79 | 7% |
| Ex | 67 | 15% |

Figure 7:
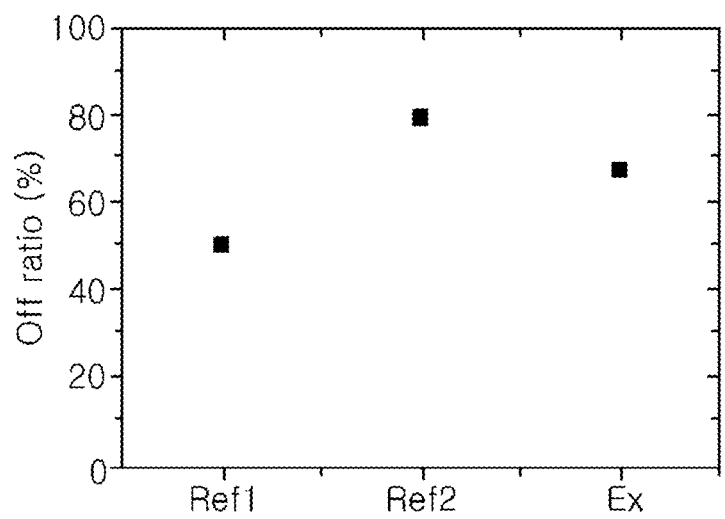
FIG. 7 is a graph showing a driving property of a QR.
Figure 8:
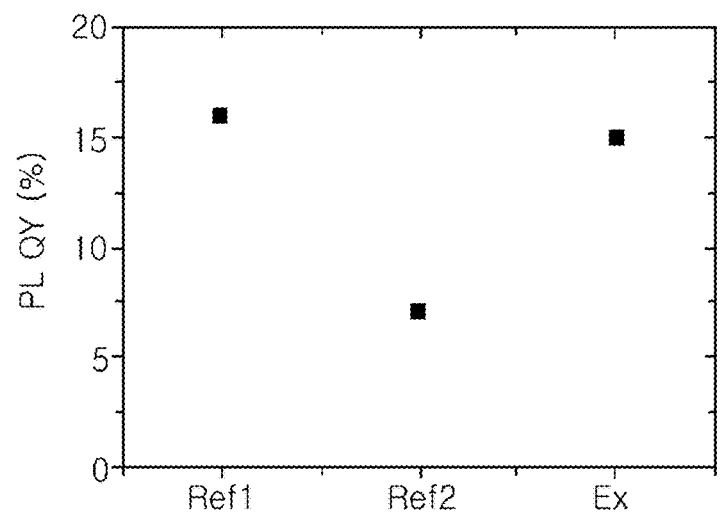
FIG. 8 is a graph showing a quantum efficiency of a QR.

As shown in Table 2 and FIGS. 7 and 8, in the QR of the present invention, the trade-off relation between the quantum efficiency and the off property according to the core length of the QR is overcome, and the QR has sufficient quantum efficiency and the off property. Namely, the QR of the present invention has advantages in both the quantum efficiency and the off property.

Figure 9:
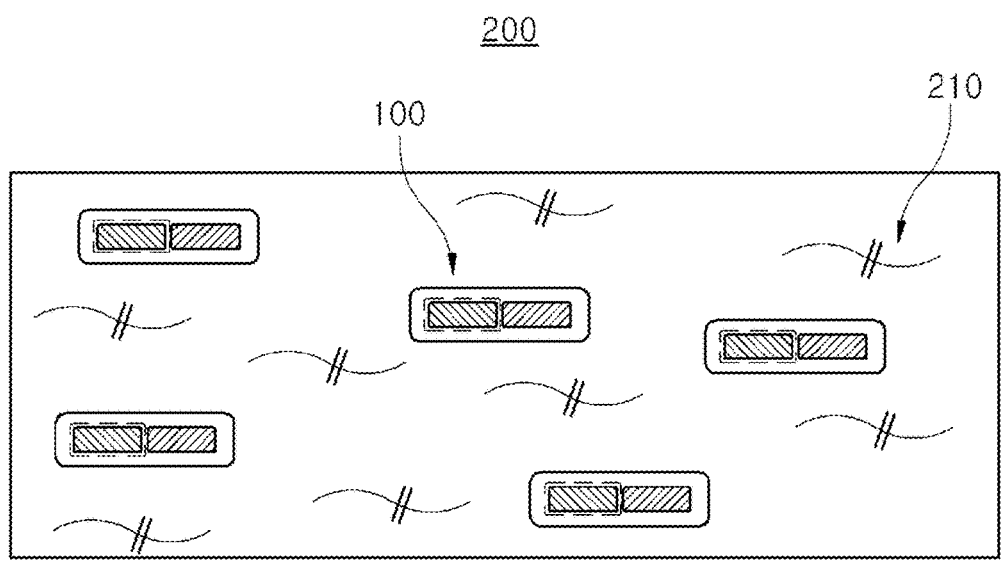
FIG. 9 is a schematic cross-sectional view of a QR film according to a second embodiment of the present invention.

FIG. 9 is a schematic cross-sectional view of a QR film according to a second embodiment of the present invention.

As shown in FIG. 9, a QR film 200 includes a polymer matrix 210 and a QR 100 arranged in the polymer matrix 210. Namely, the QR 100 is dispersed in the polymer matrix 210.

As explained with FIG. 3, the QR 100 includes the first core 110, the second core 120, which is spaced apart from the first core 110, and the first shell 130 surrounding the first and second cores 110 and 120. The first core 110 has a first length L1, and the second core 120 has a second length L2 being substantially same as the first length L1. The QR 100 may further include a second shell 112 surrounding the first core 110.

For example, the polymer matrix 210 may include polyoxetane, polysiloxane or polyester, but it is not limited thereto.

As mentioned above, the QR 100 has the dual-core structure, and the QR 100 has advantages in both the quantum efficiency and the driving property (off property). Accordingly, the QR film 200 including the QR 100 also has advantages in both the quantum efficiency and the driving property (off property).

Figure 10:
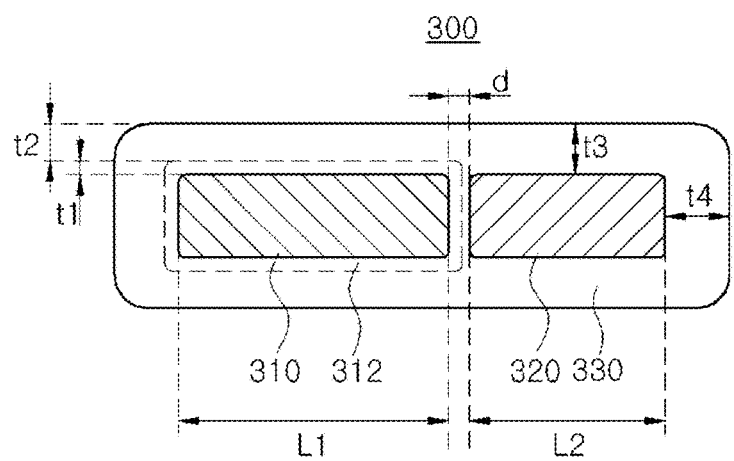
FIG. 10 is a schematic cross-sectional view of a QR according to a third embodiment of the present invention.

FIG. 10 is a schematic cross-sectional view of a QR according to a third embodiment of the present invention.

As shown in FIG. 10, the QR 300 includes a first core 310, a second core 320, which is spaced apart from the first core 310, and a first shell 330 surrounding the first and second cores 310 and 320.

Each of the first and second cores 310 and 320 may include the XII-XVI group semiconductor material, the XIII-XV group semiconductor material, the XI-XIII-XVI group semiconductor material or the XIV-XVI group semiconductor material. The first and second cores 310 and 320 may include the same material or different materials.

For example, each of the first and second cores 310 and 320 may include one of CdSe, CdS, CdTe, ZnSe, ZnS, ZnTe, HgSe, HgTe, CdZnSe (XII-XVI group semiconductor material), InP, InN, GaN, InSb, InAsP, InGaAs, GaAs, GaP, GaSb, AlP, AlN, AlAs, AlSb (XIII-XV group semiconductor material), PbSe, PbTe, and PbS (XIV-XVI group semiconductor material).

The first core 310 has a first length L1, and the second core 320 has a second length L2 being smaller than the first length L1. Namely, along a major axis of the QR 300, the first and second cores 310 and 320 have different lengths such that first and second color lights, which are different, are emitted from the first and second cores 310 and 320, respectively. Accordingly, the QR 300 provides third color light different from the first and second color lights.

For example, the first core 310 may emit red light, and the second core 320 may emit green light.

The first shell 330 may include the XII-XVI group semiconductor material. For example, the first shell 330 may include one of ZnS, ZnSe, ZnTe, CdSe, CsTe, CdS, CdSeS, CdTeS, CdSeTe, ZnSeS, ZnTeS, ZnSeTe, CdZnSe, CdZnS, CdZnTe, CdZnSeS, CdZnTeS and CdZnSeTe.

As shown in FIG. 10, the QR 300 of the present invention has a dual core structure.

In addition, the QR 300 may further include a second shell 312 surrounding the first core 310. The second shell 312 may include the same material as the first shell 330 or a different material from the first shell 330. The second core 320 contacts the second shell 312.

In FIG. 10, the first length L1 of the first core 310, which is surrounded by the second shell 312, is greater than the second length L2 of the second core 320. Alternatively, the first core 310 may have a length being smaller than the second core 320.

The second shell 312 has a first thickness t1, and the first shell 330 has a second thickness t2, which is greater than the first thickness t1, in a portion corresponding to the first core 310 or the second shell 312. When the first thickness t1 of the second shell 312 is too large, the first and second cores 310 and 320 are independently driven with an electric field such that there may be a problem in the off property of the QR 300.

On the other hand, when the second shell 312 is formed of the same material as the first shell 330, it seems to appear that the first shell 330 directly surrounds the first and second cores 310 and 320 without the second shell 312.

In the present invention, the QR 300, where the first and second cores 310 and 320 are arranged to be separated, and the first shell 330 surrounding the first and second cores 310 and 320, is provided. In this instance, a distance d between the first and second cores 310 and 320 is smaller than a thickness t3 or t4 of the first shell 330.

In the QR 300 of the present invention, since the first and second cores 310 and 320 are separated from each other to provide the dual-core structure, the off property of the QR 300 is increased without decrease of the quantum efficiency. Accordingly, the QR film and the QR display device including the QR 300 have high brightness and high contrast ratio.

Figure 11:
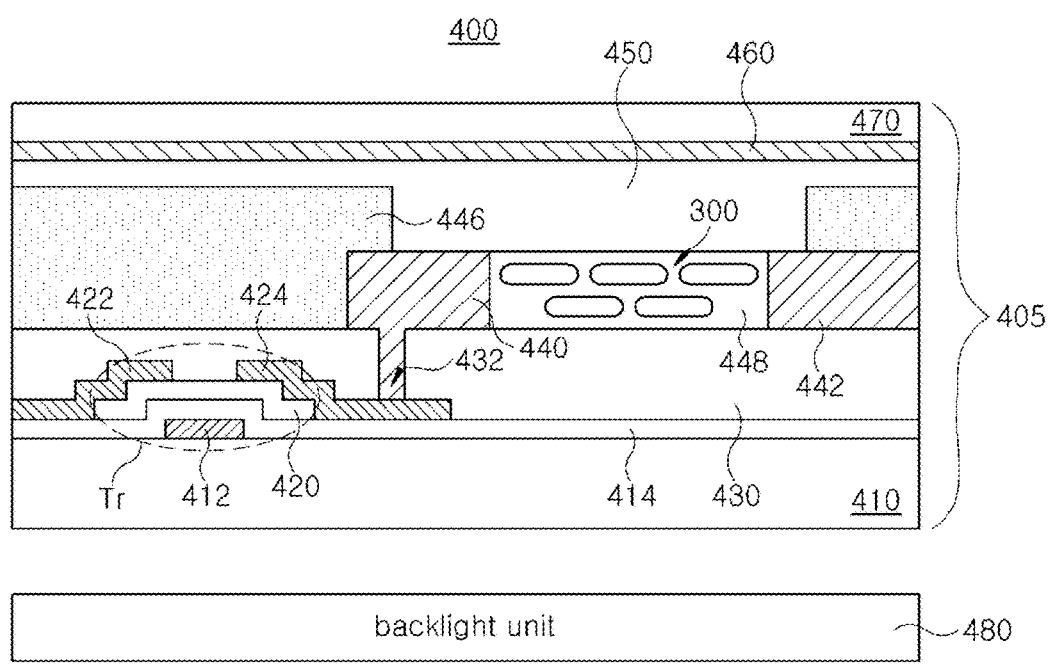
FIG. 11 is a schematic cross-sectional view of a QR display device according to a first embodiment of the present invention.
Figure 12:
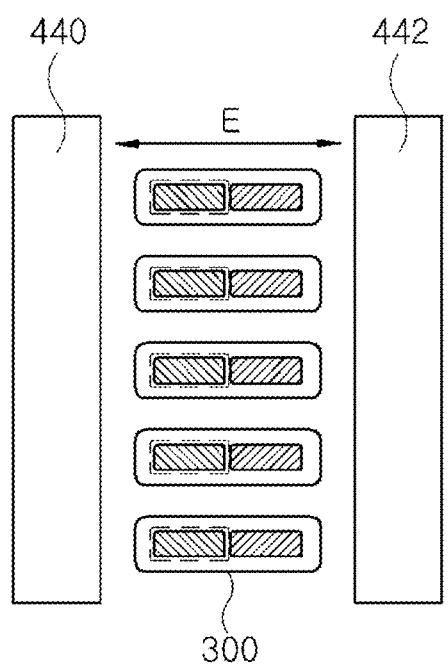
FIG. 12 is a schematic plane view illustrating the arrangement of QRs in the QR display device according to an embodiment of the present invention.

FIG. 11 is a schematic cross-sectional view of a QR display device according to a first embodiment of the present invention, and FIG. 12 is a schematic plane view illustrating the arrangement of QRs in the QR display device.

As shown in FIG. 11, a QR display device 400 the present invention includes a QR panel 405 and a backlight unit 480 under the QR panel 405. The backlight unit 480 provides light toward the QR panel 405.

The QR panel 405 includes a first substrate 410, which is positioned to be closer to the backlight unit 480, a pixel electrode 440, a common electrode 442, a second substrate 470 facing the first substrate 410 and a QR layer 448 between the first and second substrates 410 and 470. The pixel electrode 440 and the common electrode 442 are positioned on or over the first substrate 410.

Each of the first and second substrates 410 and 470 is a glass substrate or a plastic substrate. For example, when the first and second substrates 410 and 470 is a flexible substrate or a flexible film, which may be formed of polyimide, the QR display device 400 may be a foldable display device, a bendable display device or rollable display device.

On the first substrate 410, a gate line and a data line are formed, and the gate and data lines cross each other to define a pixel region.

In each pixel region, a thin film transistor (TFT) Tr as a switching element is formed, and the pixel electrode 440 is electrically connected to the TFT Tr.

The TFT Tr may include a gate electrode 412 on the first substrate 410, a semiconductor layer 420, a source electrode 422 and a drain electrode 424. The semiconductor layer 420 is disposed over the gate electrode 412 and overlaps the gate electrode 412. The source electrode 422 and the drain electrode 424 are disposed on the semiconductor layer 420 and are spaced apart from each other.

The gate electrode 412 is connected to the gate line, and the source electrode 422 is connected to the data line. Namely, the TFT Tr is electrically connected to the gate line and the data line.

A gate insulating layer 414, which is formed of an inorganic insulating material, e.g., silicon oxide or silicon nitride, is formed between the gate electrode 412 and the semiconductor layer 420.

A passivation layer 430, which includes a drain contact hole 432 exposing the drain electrode 424, is formed on or over the TFT Tr. The pixel electrode 440 and the common electrode 442 are positioned on the passivation layer 430.

The pixel electrode 440 is connected to the drain electrode 424 through the drain contact hole 432.

Each of the pixel electrode 440 and the common electrode 442 may include a transparent conductive material or a low resistance metallic material. For example, the transparent conductive material may be indium-tin-oxide (ITO) or indium-zinc-oxide (IZO), and the low resistance metallic material may be copper (Cu), aluminum (Al) or their alloy.

In FIG. 11, one pixel electrode 440 and one common electrode 442 are arranged to be spaced apart from each other, but it is not limited thereto. For example, a plurality of pixel electrodes 440 and a plurality of common electrodes 442 are alternately arranged to be spaced apart from each other.

On the passivation layer 430, a wall (or partition) 446 surrounding each pixel region is formed. Namely, the wall 446 may have a lattice shape to surround the pixel region. The QR layer 448 in each pixel region is separated by the wall 446 such that adjacent pixel regions may provide the red light, the green light and the blue light. The wall 446 may serve as a light-shielding element. The wall 446 may be omitted.

The QR layer 448 including the QR 300 (or 100 of FIG. 3) is positioned on or over the passivation layer 430 and is separated in each pixel region due to the wall 446. Namely, the QR layer 448 is positioned between the pixel electrode 440 and the common electrode 442 and contacts the pixel and common electrode 440 and 442. A lower surface of the QR layer 448 contacts the passivation layer 430.

Referring to FIG. 3, the QR may include the first core 110, the second core 120, which is spaced apart from the first core 110 and has substantially the same length as the first core 110, and the first shell 130 surrounding the first and second cores 110 and 120.

Alternatively, referring to FIG. 10, the QR may include the first core 310, the second core 320, which is spaced apart from the first core 310 and has a different length from the first core 310, and the first shell 330 surrounding the first and second cores 310 and 320.

Namely, the QR 300 has the dual-core structure.

A planarization layer 450 may be formed on the wall 446 and the QR layer 448. A step difference, which may be generated by the wall 446 and the QR layer 448, may be compensated by the planarization layer 450 such that a flat top surface may be provided. The planarization layer 450 may be omitted.

A protection layer for protecting the QR layer 448 may be formed on the planarization layer 450. Since the QR 300 may be damaged by outer moisture or outer oxygen, the protection layer may be formed to prevent the damage of the QR 300.

The second substrate 470 is formed over the planarization layer 450. The second substrate 470 may be attached using an adhesion layer 460.

A polarization plate (or film) may be disposed on an outer side of the second substrate 470. Alternatively, without the second substrate 470, the polarization plate may be attached to the planarization layer 450 by the adhesion layer 460.

The backlight unit 480 includes a light source. Since the QR 300 absorbs the short-wavelength light and emits the visible light, the backlight unit 480 includes the short-wavelength light source. For example, the light source may be a UV light source.

The backlight unit 480 may be a direct type. Namely, in the backlight unit 480, a plurality of light sources are arranged under the QR panel 405 to directly provide the light toward the QR panel 405. In this instance, the backlight unit 480 may further include a reflective sheet under the light sources and an optical sheet between the light sources and the QR panel 405.

Alternatively, the backlight unit 480 may be an edge type. Namely, the backlight unit 480 may further include a light guide plate under the QR panel 405, and the light source is positioned at a side of the light guide plate. The edge type backlight unit 480 may further include a reflective sheet under the light guide plate and an optical sheet between the light guide plate and the QR panel 405.

The QR layer 448 is driven by an electric field induced between the pixel electrode 440 and the common electrode 442. The QR layer 448 absorbs the light from the backlight unit 480 and emits a linearly-polarized visible light.

Referring to FIG. 12, the QR 300 has a rod shape having a major axis and a minor axis, and the QR 300 is arranged such that the major axis of the QR 300 is parallel to the electric field E between the pixel 440 and common electrodes 442. In other words, the major axis of the QR 300 is arranged along a direction being substantially perpendicular to an extension direction of the pixel 440 and common electrodes 442.

When the electric field E is generated between the pixel and common electrode 440 and 442 by applying voltages, the randomly-dispersed QRs 300 are arranged such that the major axis of the QRs 300 to be parallel to the direction of the electric field E. By performing a curing process, the QR layer 448, where the major axis of the QRs 300 to be parallel to the direction of the electric field E between the pixel and common electrode 440 and 442, can be provided. Namely, an alignment layer and an aligning process, which are required in the related art LCD device, can be omitted in the present invention.

In addition, since the QRs 300 can emit different color lights, e.g., red light, green light and blue light, a color filter, which is required in the related art LCD device, can be omitted in the present invention.

As explained with FIG. 10, when the first core 310 and the second core 320 have different sizes, the first core 310 and the second core 320 may emit the red light and the green light, respectively. In this instance, the backlight unit 480 includes a blue light source such that the QR layer 448 may provide a white light. Color filter patterns corresponding to each pixel region are formed on the second substrate 470 such that a full-color image can be displayed.

Namely, with a single core QR, different QRs and a blue light source are required to provide a white light. However, in the present invention, the white light is provided with a single QR having the first and second cores with different sizes.

In the present invention, the QR 300 having the dual-core structure has advantages in both the quantum efficiency and the driving property (off property). Accordingly, the QR display device 400 including the QR 300 also has advantages in both the quantum efficiency and the driving property (off property).

FIG. 11 shows a display device using the QR 300, but it is not limited thereto. For example, the QR 300 may be used for the lightening device.

It will be apparent to those skilled in the art that various modifications and variations can be made in the embodiments of the invention without departing from the spirit or scope of the invention. Thus, it is intended that the modifications and variations cover this invention provided they come within the scope of the appended claims and their equivalents.

What is claimed is:

1. A quantum rod, comprising:
a first core;
a second core separated from the first core; and
a first shell surrounding the first and second cores,
wherein a thickness of the first shell is greater than a distance between the first and second cores.

2. The quantum rod of claim 1, wherein the first core has a length being substantially same as the second core.

3. The quantum rod of claim 1, wherein the first core has a length being different from the second core.

4. The quantum rod of claim 3, wherein the first core emits a first color light, and the second core emits a second color light.

5. The quantum rod of claim 1, further comprising:
a second shell inside the first shell and surrounding the first core.

6. The quantum rod of claim 5, wherein the second shell has a first thickness, and the first shell has a second thickness in a portion corresponding to the second shell, and
wherein the second thickness is greater than the first thickness.

7. The quantum rod of claim 5, wherein the second core contacts the second shell.

8. A quantum rod film, comprising:
a polymer matrix; and
a quantum rod in the polymer matrix, the quantum rod including:
a first core;
a second core separated from the first core; and
a first shell surrounding the first and second cores.

9. The quantum rod film of claim 8, wherein a thickness of the first shell is greater than a distance between the first and second cores.

10. The quantum rod film of claim 8, wherein the first core has a length being substantially same as the second core.

11. The quantum rod film of claim 8, wherein the first core has a length being different from the second core.

12. The quantum rod film of claim 8, wherein the quantum rod further includes a second shell inside the first shell and surrounding the first core.

13. The quantum rod film of claim 12, wherein the second shell has a first thickness, and the first shell has a second thickness in a portion corresponding to the second shell, and wherein the second thickness is greater than the first thickness.

14. A quantum rod display device, comprising:
first and second substrates facing each other;
a pixel electrode and a common electrode on the first substrate;
a quantum rod layer positioned between the first substrate and the second substrate and including a quantum rod, the quantum rod including:
a first core,
a second core separated from the first core, and
a first shell surrounding the first and second cores; and
a backlight unit under the first substrate.

15. The quantum rod display device of claim 14, wherein a thickness of the first shell is greater than a distance between the first and second cores.

16. The quantum rod display device of claim 14, wherein the first core has a length being substantially same as the second core.

17. The quantum rod display device of claim 14, wherein the first core has a length being different from the second core.

18. The quantum rod display device of claim 14, wherein the quantum rod further includes a second shell inside the first shell and surrounding the first core.

19. The quantum rod display device of claim 18, wherein the second shell has a first thickness, and the first shell has a second thickness in a portion corresponding to the second shell, and
wherein the second thickness is greater than the first thickness.

20. A quantum rod, comprising:
a first core;
a second core separated from the first core;
a first shell surrounding the first and second cores; and
a second shell inside the first shell and surrounding the first core.

21. The quantum rod of claim 20, wherein the second shell has a first thickness, and the first shell has a second thickness in a portion corresponding to the second shell, and
wherein the second thickness is greater than the first thickness.

22. The quantum rod of claim 20, wherein the second core contacts the second shell.

* * * * *